United States Patent [19]

Simon

[11] Patent Number: 4,573,141
[45] Date of Patent: Feb. 25, 1986

[54] MEMORY INTERFACE FOR COMMUNICATING BETWEEN TWO STORAGE MEDIA HAVING INCOMPATIBLE DATA FORMATS

[75] Inventor: Francois Y. Simon, Raleigh, N.C.

[73] Assignee: General Electric Company, Somersworth, N.H.

[21] Appl. No.: 599,683

[22] Filed: Apr. 12, 1984

[51] Int. Cl.[4] .......................... G06F 3/00; G06F 13/00
[52] U.S. Cl. .................................. 364/900; 364/464; 364/483; 365/189
[58] Field of Search ............................. 370/60, 82–83, 370/99; 364/464, 481, 492, 483, 200 MS File, 900 MS File; 365/189, 212

[56] References Cited

U.S. PATENT DOCUMENTS

| 3,638,195 | 1/1972 | Brender et al. | 364/200 |
| 3,731,278 | 5/1973 | Eldridge et al. | 364/900 |
| 4,205,200 | 5/1980 | Parikh et al. | 370/83 |
| 4,205,351 | 5/1980 | Michals | 360/4 |
| 4,321,668 | 3/1982 | Flynn et al. | 364/200 |
| 4,387,433 | 6/1983 | Cardenia | 364/491 |
| 4,408,271 | 10/1983 | Kindell | 364/200 |
| 4,408,272 | 10/1983 | Walters | 364/200 |

Primary Examiner—James D. Thomas
Assistant Examiner—A. Williams, Jr.
Attorney, Agent, or Firm—Robert E. Brunson; Thomas R. Morrison

[57] ABSTRACT

An electronic demand register for an electric meter includes a volatile storage for normal processing of data and a non-volatile storage into which data is serially written upon the occurrence of conditions which may threaten the integrity of such data and from which the data is again retrieved when the condition no longer exists. The data formats for transmission of the data to the non-volatile memory and for receiving it therefrom do not agree with the data formats which the volatile storage must have. A communications buffer assembles a data package for transmission to the non-volatile memory which has a format which can be suitably serially transmitted to the non-volatile memory and be properly interpreted there due to the manner in which the non-volatile memory recognizes and stores data. In addition, the communications buffer receives the serial data from the non-volatile memory and, by left shift and selection of only valid portions of the data, assembles data suitable for transmission to the volatile memory.

3 Claims, 5 Drawing Figures

MEMORY INTERFACE FOR COMMUNICATING BETWEEN TWO STORAGE MEDIA HAVING INCOMPATIBLE DATA FORMATS

BACKGROUND OF THE INVENTION

The present invention relates to electric meters and, more particularly, to a memory interface for electronic demand registers of electric meters.

Conventional electric meters employ an aluminum disk driven as a rotor of a small induction motor by an electric field at a speed which is proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

In addition to the above measurement of consumption, some electric meters contain means for separating the consumption into those parts of consumption occurring during peak and off-peak hours (however defined) and for recording maximum demand during a predetermined period of time in order to adjust billing according to such parameters. In one such demand meter disclosed in U.S. Pat. No. 3,586,974, a mechanical demand register records the power usage during a predetermined period of time and stores the value for reading. The predetermined period of time may be, for example, the time between meter readings, or a period of time corresponding to the billing period of the utility providing the power. A clockwork mechanism restarts the demand register at regular intervals of, for example, a fraction of an hour, so that, at the end of the predetermined period, the stored value represents the highest value of power usage occurring during any one of the regular intervals in the predetermined period.

Demand registers of the mechanical type, such as disclosed in the above U.S. Patent, have limited flexibility. Once their design is completed for a particular meter physical configuration, the design is not transferable to a meter having a different physical configuration. In addition, the demand-measurement functions cannot be redefined without major mechanical redesign.

Greater flexibility may be obtainable using electronic acquisition, integration and processing of power usage. An electronic processor such as, for example, a microprocessor, may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the power usage during defined periods of time.

An electronic processor of an electronic demand register conventionally employs volatile random access memory for the high speed and low power consumption characteristics offered by such devices. However, several events can occur during normal and emergency conditions which can threaten the integrity of data being recorded for billing purposes in volatile random access memory. If a power outage, by removing power from the processor and the random access memory, were allowed to erase all data stored in random access memory, then the billing data contained in the erased data would be lost. This is, of course, unacceptable. Some means, therefore, appears desirable for storing data in non-volatile memory when a power outage occurs. On the converse, certain normal deviations of the line power, such as, for example, momentary overvoltage, surges, noise and momentary power outages enduring for a very short time period, must be tolerated. Apparatus for storing data in a non-volatile memory during power outages is disclosed in U.S. patent application Ser. No. 599,736 filed on the same date as the present application.

Testing of an electronic demand register may conveniently be performed by interrupting the normal processing being done by an electronic demand register and inserting test data into the volatile memory elements. In order to avoid losing billing data and certain programmed constants while the volatile memory elements are used for test operation, such items are also stored in non-volatile memory in a manner generally analogous to the technique used for storing them in the event of a power outage. Apparatus for storing data in a non-volatile memory during test operation is disclosed in U.S. patent application Ser. No. 599,735 filed on the same date as the present application.

The volatile memory and non-volatile memory may require incompatible data formats. That is, a microprocessor containing the volatile memory may be restricted to producing blocks of output which have too many, or too few, bits for reception by the volatile memory and vice versa. Without a technique for translating the language of each of these devices into the language of the other, they are incapable of communicating with each other.

OBJECTS AND SUMMARY OF THE INVENTION

Accordingly, it is an object of the invention to provide an electronic demand register having a memory interface which permits communication between a non-volatile memory and a volatile memory.

It is a further object of the invention to provide an electronic demand register in which a communications buffer assembles a data package for transmission to the non-volatile memory which, because of the manner in which the non-volatile memory recognizes and stores data, forces compatibility between the data formats.

It is a further object of the invention to provide an electronic demand register in which a communications buffer shifts and discards data serially received from the non-volatile memory to place the data in a format which is acceptable for communication to the volatile memory.

Briefly stated, the present invention provides an electronic demand register for an electric meter which includes a volatile storage for normal processing of data and a non-volatile storage into which data is serially written upon the occurrence of conditions which may threaten the integrity of such data and from which the data is again retrieved when the condition no longer exists. The data formats for transmission of the data to the non-volatile memory and for receiving it therefrom do not agree with the data formats which the volatile storage must have. A communications buffer assembles a data package for transmission to the non-volatile memory which has a format which can be suitably serially transmitted to the non-volatile memory and be properly interpreted there due to the manner in which the non-volatile memory recognizes and stores data. In addition, the communications buffer receives the serial data from the non-volatile memory and, by left shift and selection of only valid portions of the data, assembles data suitable for transmission to the volatile memory.

According to an embodiment of the invention, there is provided apparatus for communicating between a first memory capable of sending and receiving first data words having a first number of bits and a second memory capable of sending and receiving second data words having a second number of bits wherein neither of the first or the second numbers of bits is evenly divisible by the other thereof, comprising means for assembling a first predetermined number of the first data words into a first data block, means for appending a leading word to the first data block, means for serially transmitting the leading word and the first data block to the second memory, the leading word including a pattern of bits which are at least partly ignored by the second memory and a remainder of the leading word, together with the first data block, forming the second data word whereby the second memory is effective to receive data from the first memory, means for serially receiving a second predetermined number of the second words from the second memory, means for forming the second predetermined number of the second words into a second data block, means for performing one of a shift and a selective transfer on the second predetermined number of the second words whereby the second words in the second data block are converted to a third data block, the third data block being a third predetermined number of the first data words and means for communicating the third data block to the first memory.

According to a feature of the invention, there is provided a method for communicating between a first memory capable of sending and receiving first data words having a first number of bits and a second memory capable of sending and receiving second data words having a second number of bits wherein neither of the first or the second numbers of bits is evenly divisible by the other thereof, comprising assembling a first predetermined number of the first data words into a first data block, appending a leading word to the first data block, serially transmitting the leading word and the first data block to the second memory, the leading word including a pattern of bits which are at least partly ignored by the second memory and a remainder of the leading word, together with the first data block, forming the second data word whereby the second memory is effective to receive data from the first memory, serially receiving a second predetermined number of the second words from the second memory, forming the second predetermined number of the second words into a second data block, performing one of a shift and a selective transfer on the second predetermined number of the second words whereby the second words in the second data block are converted to a third data block, the third data block being a third predetermined number of the first data words and communicating the third data block to the first memory.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Although the present invention may be adapted to any suitable style of electric meter which employs an element rotating at a speed proportional to power consumption, including single phase meters with one or more current windings and polyphase meters, for concreteness, the detailed description which follows is directed toward an illustrative example of a 2-wire single phase meter of the type having a single current coil and a single voltage coil.

Figure 1:
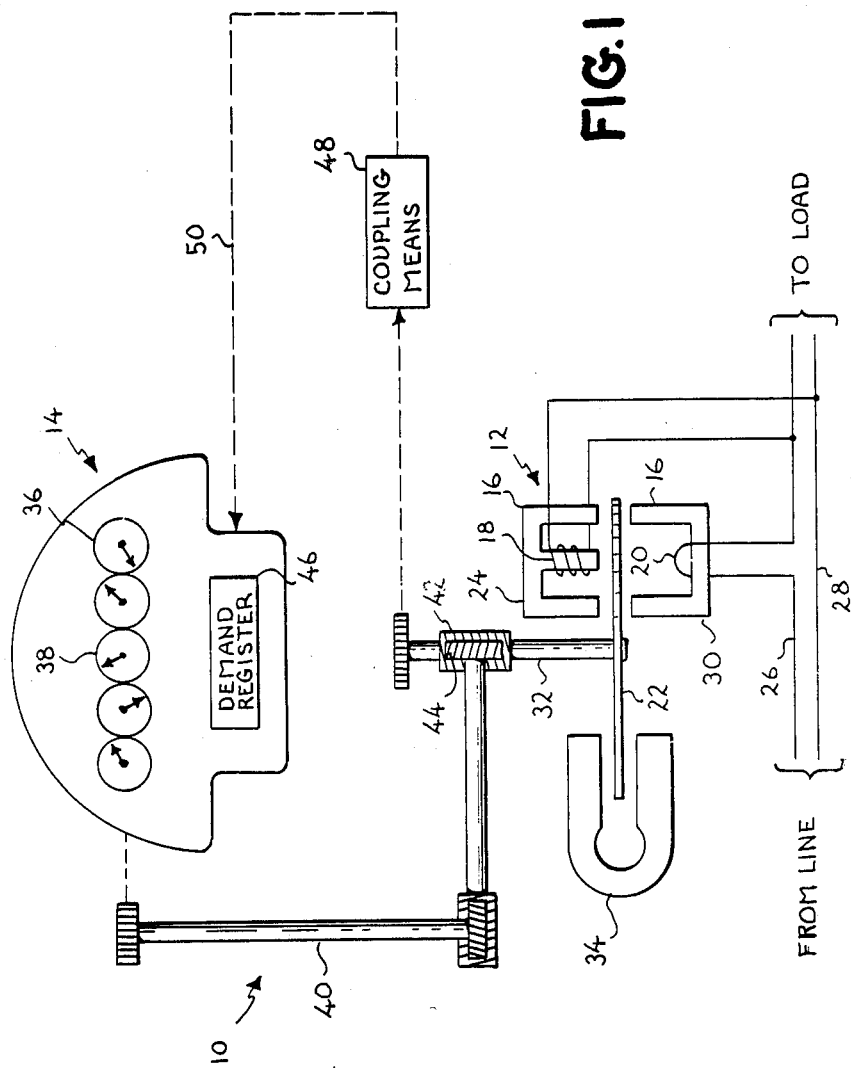
FIG. 1 is a schematic diagram of an electric meter to which the present invention may be applied.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 20 upon which a small number of turns, typically one or two, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20 combined with the retarding torque produced by permanent magnet 34 is effective to rotate disk 22 at a speed which is proportional to the product of the voltage and the current; that is, the power consumed by the load.

Register 14 includes a watthour register 36 which may include, for example, a plurality of dials 38 which are suitably geared and driven by a suitable mechanical coupling 40 in proportion to the rotation of shaft 32. In the embodiment shown, mechanical coupling 40 includes a worm 42, which may be integrally formed in shaft 32, which engages and rotates a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46, shown schematically as a box in FIG. 1, is also connnected by a suitable coupling means 48 to respond to the rotation of shaft 32. In the prior art, demand register 46 is conventionally a mechanical register having dials, or other indicating devices (not shown), and coupling means 48 is conventionally a mechanical arrangement including shafts and gearing driven by rotation of shaft 32. The dials or indicating devices in the mechanical embodiment of demand register 46 are urged forward for a fixed period of time by a pusher mechanism (not shown). The pusher mechanism is reset and restarted at the end of each of the fixed periods of time, leaving the indicating devices with an indication proportional to the power usage (the demand) during the fixed period of time. The indication on the indicating devices at any time is, therefore, the highest demand which has occurred during any of the time periods since the last time the indicating devices were reset. The recorded demand is employed in billing. In the present invention, demand register 46 is an electronic demand register.

Figure 2:
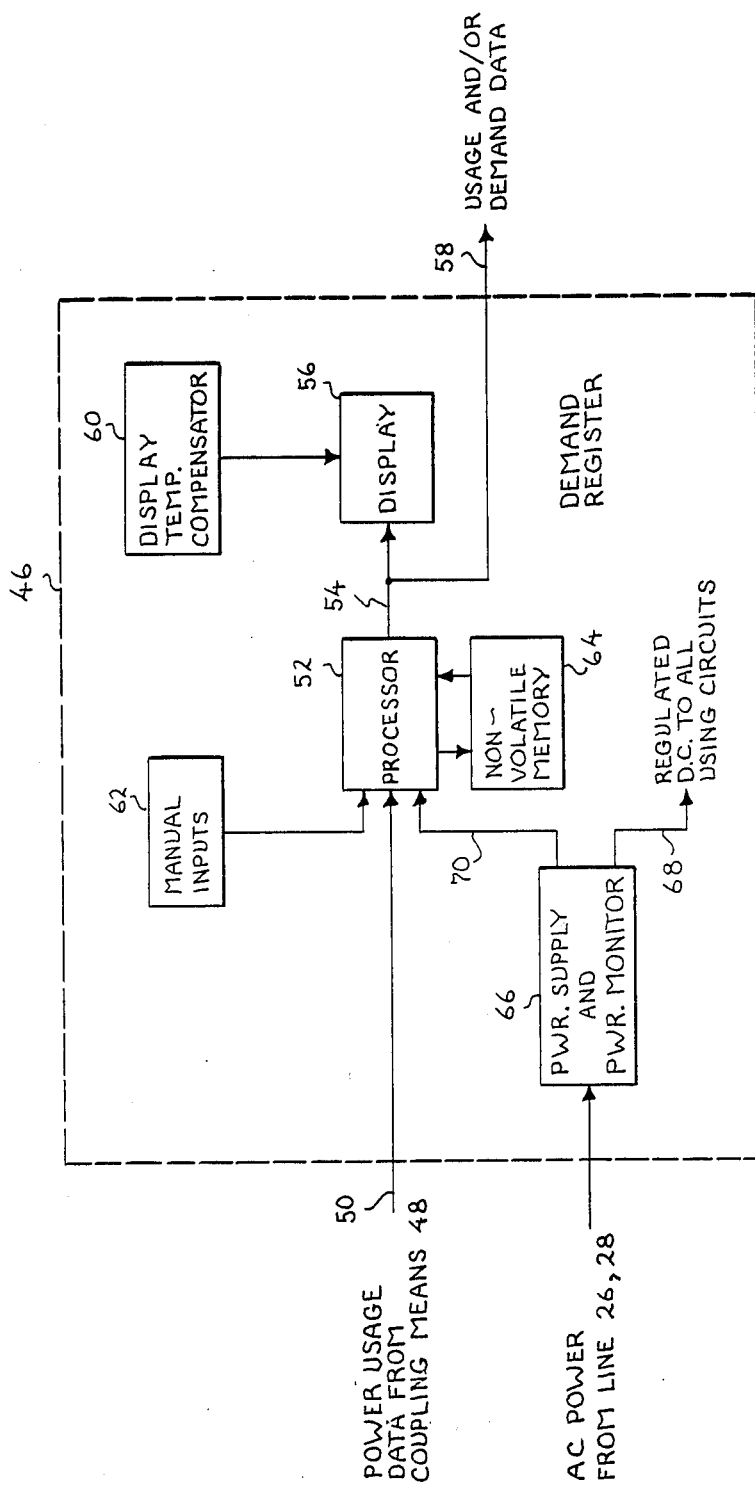
FIG. 2 is a block diagram of a demand register of FIG. 1 according to an embodiment of the invention.

Referring now to FIG. 2, there is shown, a simplified block diagram of a demand register 46 according to an embodiment of the invention. For present purposes, it is sufficient to note that the signal related to power usage fed from coupling means 48 to demand register 46 is an electronic signal having a characteristic such as, for example, a frequency, which is variable in dependence on the rate of power usage. Any suitable electronic signal generating apparatus, such as disclosed in the referenced prior patents, may be employed to produce a power usage signal which is applied on a line 50 to a processor 52 in demand register 46. Processor 52 appropriately performs calculations on the usage data to derive desired demand parameters and stores the result. In addition, processor 52 may provide an output on a line 54 suitable for driving a display 56. In addition, the stored data may be transmitted on a line 58 to a remote location (not shown) for further analysis and/or billing.

Due to the extremes of environment in which electric meters may be used, display 56 may need special compensation for environmental parameters. Such special compensation may include a display temperature compensator 60 whose detailed structure and function are not of interest to the present disclosure.

As previously noted, processor 52 conventionally employs volatile random access memory elements which lose any data stored in them in the event of a power outage. This is usually not acceptible in an electric meter where such loss of usage and/or demand data has a negative financial impact on the utility supplying the electric power. Non-volatile storage elements such as, for example, electronically erasable programmable read only memory elements, are well known for use with processor 52. However, such non-volatile storage elements normally employ serial reading and writing. This provides relatively slow memory access times on the order of 10 or 20 milliseconds. This is too slow for most applications. In addition to this drawback, the power required to write such memory elements is quite high compared to that required by volatile memory elements of processor 52. Finally, a wear-out mechanism in electronically erasable programmable read only memory cells limits the number of times they can be erased and re-recorded. About 10,000 cycles of write and erase brings such a memory element to the end of its reliable useful life. Memory elements in processor 52 must, of course, be written and erased many thousands of times a day. Thus, an electronically erasable programmable read only memory would have a very short life as the operating memory for processor 52. In its role in non-volatile memory 64, however, electronically erasable programmable read only memory elements are erased and rewritten only when a relatively serious power outage occurs and possibly during a relatively small number of test cycles. Such operations are not expected to occur on a frequent enough basis in the register of an electric meter to represent a limit on the life of the register.

In order to provide safe storage for data and/or programmed constants during a power outage or a test operation, a conventional non-volatile memory 64 is provided into which such data and constants can be written in the event of a power outage and from which the data and constants can be again read upon restoration of normal conditions.

The data which processor 52 transmits for display and/or the manner in which processor 52 operates on the input data to produce internally stored values may be modified according to a manual input 62. For example, manual input 62 may contain means (not shown) for placing demand register 46 into a test mode in which the volatile memory elements in processor 52 receive and process test data rather than normal usage data. Prior to permitting the replacement of normal operating data with test data, the normal operating data and programmed constants are transmitted for storage in non-volatile memory 64 until the resumption of normal operation. The content of manual input 62 and the manner in which processor 52 and non-volatile memory 64 cooperate to store data in non-volatile memory 64 prior to a test operation and to retrieve it at the end of a test operation is detailed in the referenced patent application, the disclosure of which is herein incorporated by reference.

A power supply and power monitor 66 receives AC power from lines 26 and 28 for the production of a regulated DC voltage which is applied on a line 68 to all circuits in demand register 46 requiring such power. In addition to producing regulated DC power, power supply and power monitor 66 also monitors the condition of the AC power on lines 26 and 28 and, in response to certain detected conditions, applies control signals on a line 70 to processor 52 which controls the transfer of data from processor 52 to non-volatile memory 64 in the event of an apparent power outage and resets processor 52 in the event of an actual power outage. The detailed structure and operation of power supply and power monitor 66 is contained in the referenced patent application, the disclosure of which is herein incorporated by reference.

Problems may be encountered in passing data back and forth between processor 52 and non-volatile memory 64 due to the possibility of different and incompatible data and/or instruction formats of commercially available apparatus. In one embodiment of the invention, data is stored in processor 52, which may be a microprocessor such as, for example, a type NEC 7500 microprocessor, in four-bit nybbles but is only transmitted and received by processor 52 in 8-bit serial words which cannot be interrupted once transmission has begun. In this emmbodiment, non-volatile memory 64, which may be, for example, an NMC9306 non-volatile memory, requires either 9 bits of instruction to read or erase a 16-bit data word from non-volatile memory 64 or 25 bits of instruction to write a 16-bit word contained in the instruction in non-volatile memory 64. Neither of these requirements is evenly divisible by eight as required by the output format of processor 52. In addition, when non-volatile memory 64 transmits a block of data, the block contains a leading zero followed by 16 data bits for a total of 17 bits i.e. also not divisible by eight.

Figure 3:
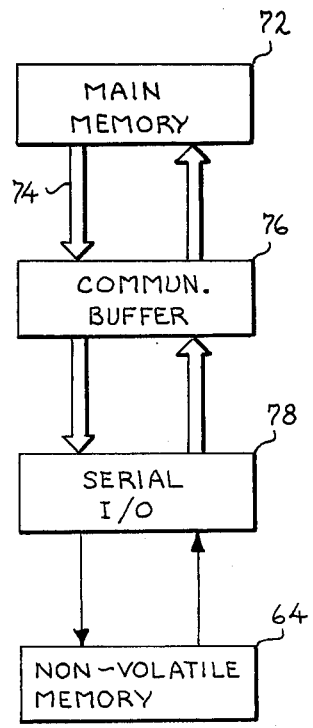
FIG. 3 is a simplified block diagram to which reference will be made in describing the manner in which data is formatted for transmission to, and after reception from, the non-voltage memory of FIG. 2.

Referring now to FIG. 3, a main memory 72 of processor 52 transmits and receives data only in parallel in four-bit nybbles as indicated by broad arrows 74 which communicate to and from a communications buffer 76. Communications buffer 76 is employed to assemble a data package received from main memory 72 in suitable form for transmission to non-volatile memory 64 or for assembling a data package received from non-volatile memory 64 in suitable form for transmission to main memory 72.

A serial input/output interface 78 sends and receives data only in eight-bit words. That is, for transmitting data to non-volatile memory 64, serial input/output interface 78 receives two of the four-bit nybbles from comunications buffer 76. Immediately that the required eight bits are received in serial input/output interface 78, serial input/output interface 78 automatically begins serial transmission of the data to non-volatile memory 64. Once serial transmission has been started, it cannot be stopped until the entire eight-bit word has been transmitted. When receiving serial data from non-volatile memory 64, as soon as eight data bits are received and stored in serial input/output interface 78, the resulting eight-bit data word is transferred in parallel from serial input/output interface 78 to two four-bit storage locations in communications buffer 76. The problem, then, is to find a way for serial input/output interface 78 to send and receive eight-bit serial data when non-volatile memory 64 requires input data and produces output data in formats which are not evenly divisible by eight.

Advantage is taken of certain characteristics of non-volatile memory 64 to permit communications buffer 76 to manage the transmission and reception of data with incompatible formats. Non-volatile memory 64 ignores leading zeros in a received word and is enabled to begin receiving data when it receives a one. Following the leading one, non-volatile memory 64 requires a four-bit operating code to tell it whether to read, erase or write, followed by an address where the operation is to take place. In the case of a write operation, the address is followed by a 16-bit data word. That is, except for a write operation, the data transmission required includes nine bits. A write operation requires 25 data bits. In addition, during a read operation, the first serial bit read out from non-volatile memory 64 is always a zero followed by 16 data bits.

Figure 4:
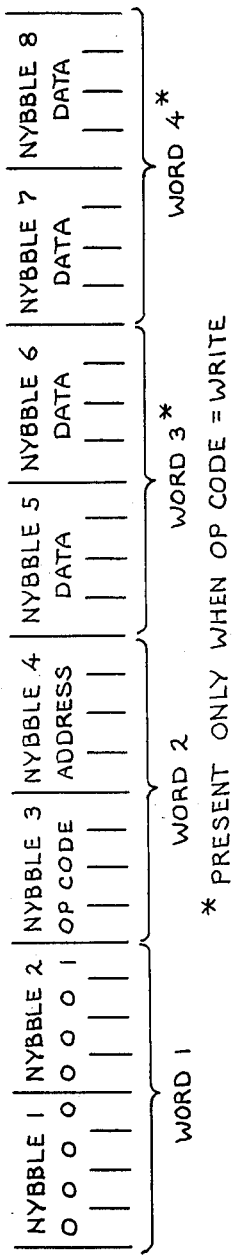
FIG. 4 is a chart showing the format of data transmitted to the non-volatile memory.

In preparation for transmitting data to non-volatile memory 64, communications buffer 76 assembles either two eight-bit words for erase or read or four eight-bit words for write (refer to FIG. 4). The first seven bits in the first eight-bit data word are zero and the eighth bit is a one. The next eight-bit word includes the four-bit operation code and the four-bit address. Since non-volatile memory 64 ignores leading zeros, the first seven bits in the first word are ignored. Non-volatile memory 64 then recognizes the one in the eighth position in the first eight-bit data word and is thereby enabled to properly receive the succeeding eight bits in the second data word for a total of nine bits received. In a write operation, the second eight-bit word is followed by an additional two eight-bit data words containing the sixteen bits of data.

Figure 5:
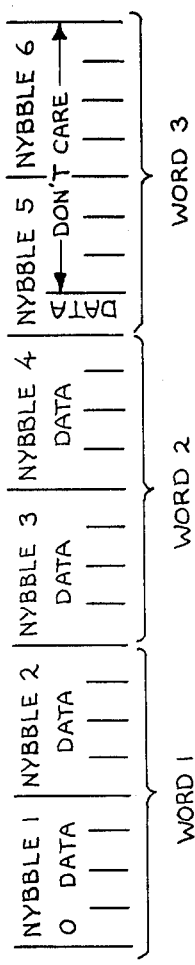
FIG. 5 is a chart showing the format of data received from the non-volatile memory.

In order to accommodate data read out from non-volatile memory 64 which, as noted above, contains a leading zero followed by 16 data bits, the first eight bits (a zero followed by seven data bits is stored in communications buffer 76 as the first received word (see FIG. 5). The next eight bits, all of which are data bits, are stored as the second data word. One additional data bit is received. This one additional data bit is positioned as the first bit in a third eight-bit data word. The state of the last seven bits in the third eight-bit data word is a matter of indifference. The three data words are then shifted one bit left in communications buffer 76. This shifts the leading zero out of the first eight-bit data word, effectively erasing it, and shifts the leading bit in the second and third eight-bit data words into the last position in the first and second eight-bit data words respectively. Upon completion of the left shift, the first and second data words contain all 16 data bits which are transmitted to main memory 72 four bits at a time. The third data word contains garbage which is discarded by failing to transmit it to main memory 72.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for communicating between a first memory capable of sending and receiving first data words having a first number of bits and a second memory capable of sending and receiving second data words having a second number of bits wherein neither of said first or said second numbers of bits is evenly divisible by the other thereof, comprising:
   means for assembling a first predetermined number of said first data words into a first data block;
   means for appending a leading word to said first data block;
   means for serially transmitting said leading word and said first data block to said second memory;
   said leading word including a pattern of bits which are at least partly ignored by said second memory and a remainder of said leading word, together with said first data block, forming said second data word whereby said second memory is effective to receive data from said first memory;
   means for serially receiving a second predetermined number of said second words from said second memory;
   means for forming said second predetermined number of said second words into a second data block;
   means for performing one of a shift and a selective transfer on said second predetermined number of said second words whereby said second words in said second data block are converted to a third data block, said third data block being a third predetermined number of said first data words; and
   means for communicating said third data block to said first memory.

2. A method for communicating between a first memory capable of sending and receiving first data words having a first number of bits and a second memory capable of sending and receiving second data words having a second number of bits wherein neither of said first or said second numbers of bits is evenly divisible by the other thereof, comprising:

assembling a first predetermined number of said first data words into a first data block;

appending a leading word to said first data block;

serially transmitting said leading word and said first data block to said second memory;

said leading word including a pattern of bits which are at least partly ignored by said second memory and a remainder of said leading word, together with said first data block, forming said second data word whereby said second memory is effective to receive data from said first memory;

serially receiving a second predetermined number of said second words from said second memory;

forming said second predetermined number of said second words into a second data block;

performing one of a shift and a selective transfer on said second predetermined number of said second words whereby said second words in said second data block are converted to a third data block, said third data block being a third predetermined number of said first data words; and communicating said third data block to said first memory.

3. A data communications system comprising:

a communications buffer;

a serial input/output interface;

said communications buffer including means for communicating data to and from a main memory and for communicating said data to and from said serial input/output interface;

said serial input/output interface including means for serially communicating fixed-length data words to a non-volatile memory and for serially receiving data words from said non-volatile memory;

said non-volatile memory being of a type which requires an input data format and an output data format which includes a number of bits which is not evenly divisible into or by a number of bits in said fixed-length data words;

said communications buffer including means for forming a data package for transmission through said serial input/output interface to said non-volatile memory, said data package including a leading data word appended to said data from said main memory, said leading data word including a first portion which is ignored by said non-volatile memory and a second portion which is recognized by said non-volatile memory, a combination of said second portion and said data forming said input data format compatible with said non-volatile memory;

said communications buffer including means for forming a second data block of data which has been serially received from said non-volatile memory; and said communications buffer further including means for performing at least one of a shift and a selective transfer on said second data block whereby said second data block is converted to a third data block having a format compatible with said main memory.

* * * * *